United States Patent
Tsujita et al.

(10) Patent No.: US 9,502,306 B2
(45) Date of Patent: Nov. 22, 2016

(54) PATTERN FORMATION METHOD THAT INCLUDES PARTIALLY REMOVING LINE AND SPACE PATTERN

(71) Applicant: CANON KABUSHIKI KAISHA, Tokyo (JP)

(72) Inventors: Koichiro Tsujita, Utsunomiya (JP); Tadashi Arai, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/799,897

(22) Filed: Jul. 15, 2015

(65) Prior Publication Data

US 2016/0035628 A1    Feb. 4, 2016

(30) Foreign Application Priority Data

Aug. 1, 2014 (JP) ................................ 2014-158123

(51) Int. Cl.
| | |
|---|---|
| *H01L 21/027* | (2006.01) |
| *H01L 21/8238* | (2006.01) |
| *H01L 29/06* | (2006.01) |
| *H01L 21/3213* | (2006.01) |
| *H01L 21/311* | (2006.01) |
| *H01L 21/308* | (2006.01) |
| *H01L 27/02* | (2006.01) |

(52) U.S. Cl.
CPC ... *H01L 21/823828* (2013.01); *H01L 21/0273* (2013.01); *H01L 21/3088* (2013.01); *H01L 21/31144* (2013.01); *H01L 21/32139* (2013.01); *H01L 27/0207* (2013.01); *H01L 29/0642* (2013.01)

(58) Field of Classification Search
CPC .................................................. H01L 21/3088
See application file for complete search history.

(56) References Cited

U.S. PATENT DOCUMENTS

| | | | | |
|---|---|---|---|---|
| 8,193,047 B2* | 6/2012 | Ryoo | .................... | G11C 11/412 |
| | | | | 257/E21.645 |
| 8,808,971 B2* | 8/2014 | Choi | ..................... | G03F 7/095 |
| | | | | 430/312 |
| 9,224,617 B2* | 12/2015 | Pritchard | ............ | H01L 21/3088 |
| 9,236,267 B2* | 1/2016 | De | ........................ | H01L 21/845 |
| 2010/0221919 A1* | 9/2010 | Lee | ..................... | H01L 21/0337 |
| | | | | 438/694 |

(Continued)

OTHER PUBLICATIONS

Smayling et al., "32nm and below Logic Patterning using Optimized Illumination and Double Patterning", Proc. of SPIE, USA, SPIE, 2009, vol. 7274, 7274K.

(Continued)

*Primary Examiner* — Stephen W Smoot
(74) *Attorney, Agent, or Firm* — Rossi, Kimms & McDowell LLP

(57) ABSTRACT

The present invention provides a pattern formation method of forming a pattern on a substrate by partially removing a line and space pattern formed on the substrate, comprising a first formation step of forming a first layer including a plurality of first openings on the line and space pattern, a second step of forming, on the first layer, a second layer including a second opening for exposing one or more first openings, which are used to partially remove the line and space pattern, among the plurality of first openings, and a removing step of partially removing the line and space pattern through the second opening and the first opening, wherein the plurality of first openings are located on a plurality of lines of the line and space pattern.

7 Claims, 9 Drawing Sheets

(56) References Cited

U.S. PATENT DOCUMENTS

2015/0111387 A1* 4/2015 Somervell ................. G03F 7/42
438/703
2015/0243515 A1* 8/2015 Yuan ................... H01L 21/0274
438/666

OTHER PUBLICATIONS

Yamauchi et al., "Applicability of double patterning process for fine hole patterns", Proc. of SPIE, USA, SPIE, 2012, vol. 8325, 832526.

* cited by examiner

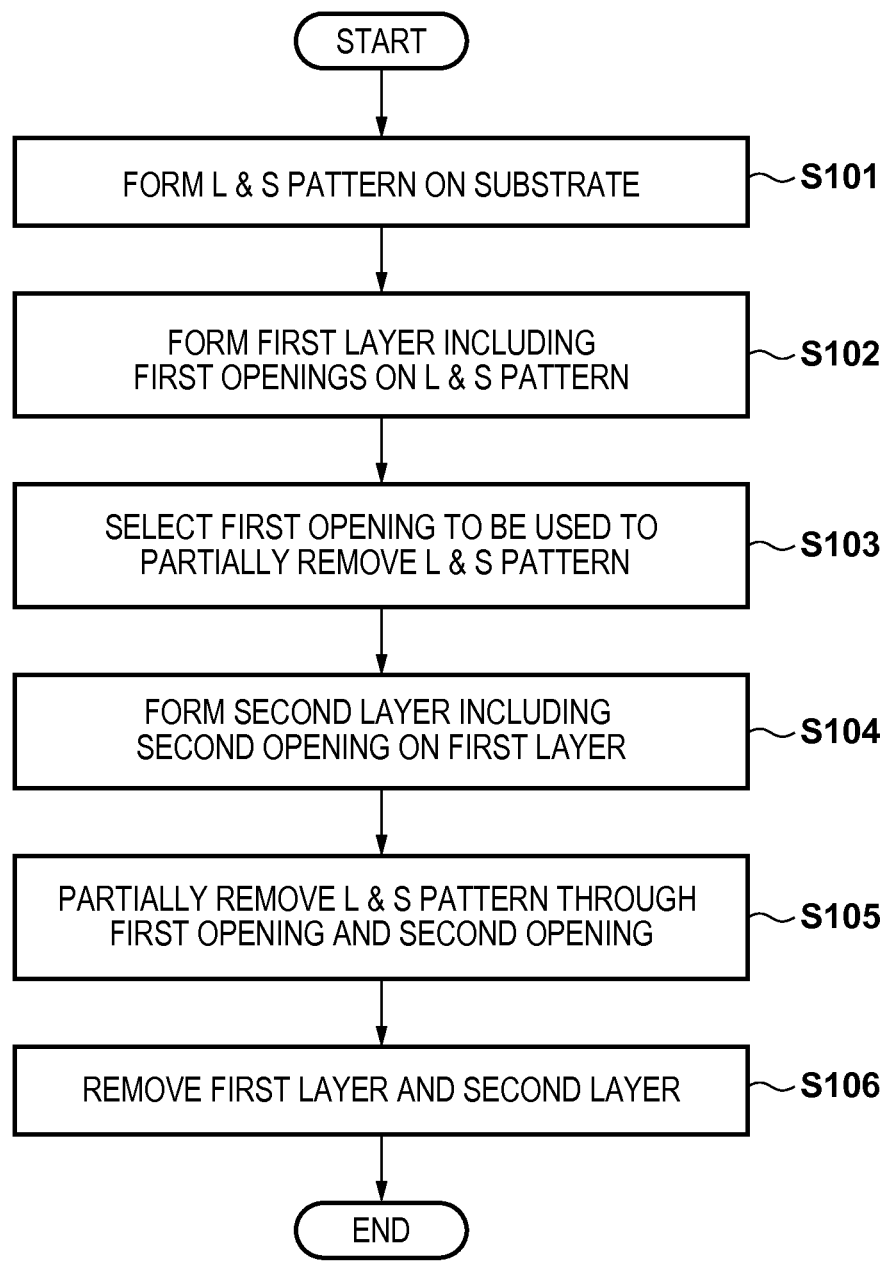

PATTERN FORMATION METHOD THAT INCLUDES PARTIALLY REMOVING LINE AND SPACE PATTERN

BACKGROUND OF THE INVENTION

Field of the Invention

The present invention relates to a pattern formation method of forming a pattern on a substrate.

Description of the Related Art

As the degrees of micropatterning and integration of circuit patterns of semiconductor integrated circuits increase, it has become difficult for a conventional method of forming a circuit pattern by using two-dimensional pattern elements to faithfully transfer a designed pattern onto a substrate by using an exposure apparatus. Therefore, non-patent literature 1 has proposed a technique of forming a circuit pattern by using only one-dimensional pattern elements, that is, a so-called one-dimension layout technique. This one-dimension layout technique disclosed in non-patent literature 1 is a technique which forms a line and space pattern (L & S pattern) having a single pitch on a substrate beforehand, and forms a circuit pattern by partially removing the L & S pattern.

A pattern which is used to partially remove the L & S pattern is called a cut pattern. A plurality of elements (cut elements) of the cut pattern can be located at the intersections of a matrix grid (even grid) having the same pitch as that of the L & S pattern. That is, the pitches of the L & S pattern and even grid are equal. However, together with recent further increasing of degrees of micropatterning and integration of circuit patterns, it has become necessary to partially remove an L & S pattern formed to have a line width or pitch smaller than the resolution limit of an exposure apparatus by using a technique such as double exposure. In this case, if a cut pattern is so designed that a plurality of cut elements are located in accordance with the even grid, the line width and pitch of the plurality of cut elements become smaller than the resolution limit of an exposure apparatus. This may make it difficult to form the plurality of cut elements on an L & S pattern by using the exposure apparatus.

Non-Patent Literature 1: Michael C. Smayling et al., "32 nm and below Logic Patterning using Optimized Illumination and Double Patterning", Proc. of SPIE, USA, SPIE, 2009, Vol. 7274, 7274K.

Non-Patent Literature 2: Shohei Yamauchi et al., "Applicability of double patterning process for fine hole patterns", Proc. of SPIE, USA, SPIE, 2012, Vol. 8325, 832526.

SUMMARY OF THE INVENTION

The present invention provides, for example, a technique which is advantageous to partially remove a line and space pattern formed to have a line width or period smaller than the resolution limit of an exposure apparatus.

According to one aspect of the present invention, there is provided a pattern formation method of forming a pattern on a substrate by partially removing a line and space pattern formed on the substrate, comprising: a first formation step of forming a first layer including a plurality of first openings on the line and space pattern; a second step of forming, on the first layer, a second layer including a second opening for exposing one or more first openings, which are used to partially remove the line and space pattern, among the plurality of first openings; and a removing step of partially removing the line and space pattern through the second opening and the first opening, wherein the plurality of first openings are located on a plurality of lines of the line and space pattern, and a plurality of first openings on one line are arranged at an interval twice a pitch of the line and space pattern along a direction in which the line extends, and an arrangement of the first openings on one of two adjacent lines and that of the first openings on the other line are shifted with each other by the pitch in the direction.

Further features of the present invention will become apparent from the following description of exemplary embodiments with reference to the attached drawings.

BRIEF DESCRIPTION OF THE DRAWINGS

FIG. 7 is a flowchart showing a pattern formation method according to this embodiment;

DESCRIPTION OF THE EMBODIMENTS

Figure 1:
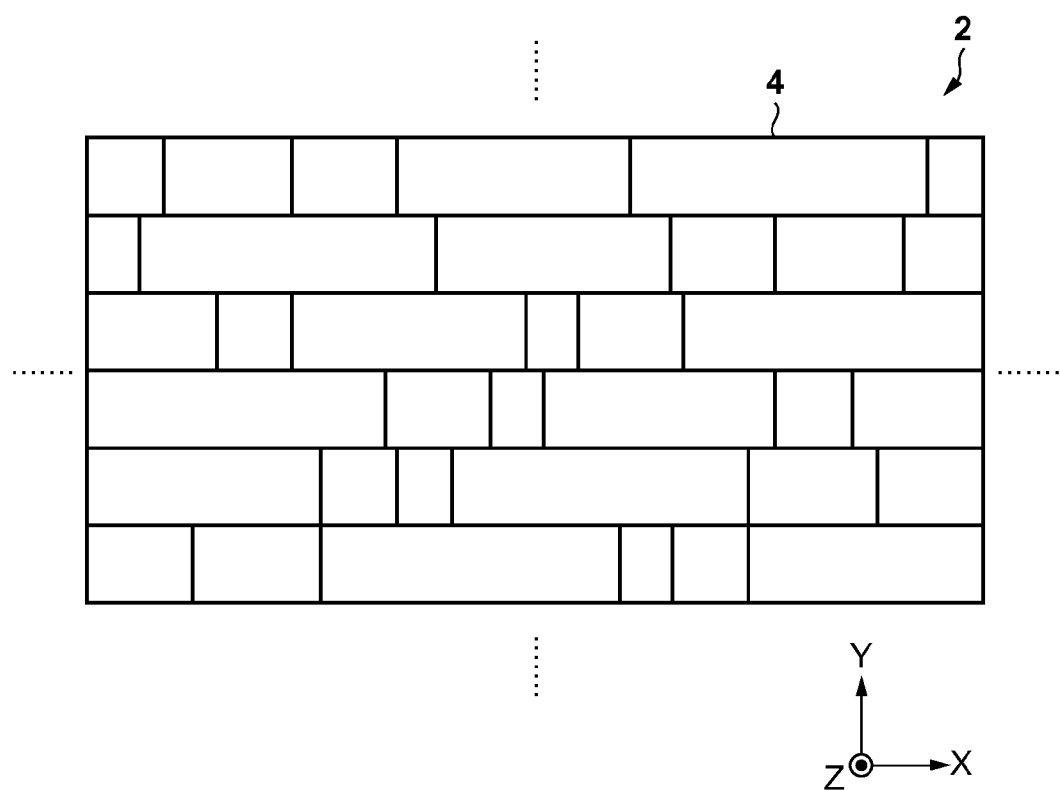
FIG. 1 is a view showing the configuration of a logic circuit.

Exemplary embodiments of the present invention will be described below with reference to the accompanying drawings. Note that the same reference numerals denote the same members throughout the drawings, and a repetitive description thereof will not be given.

Figure 2:
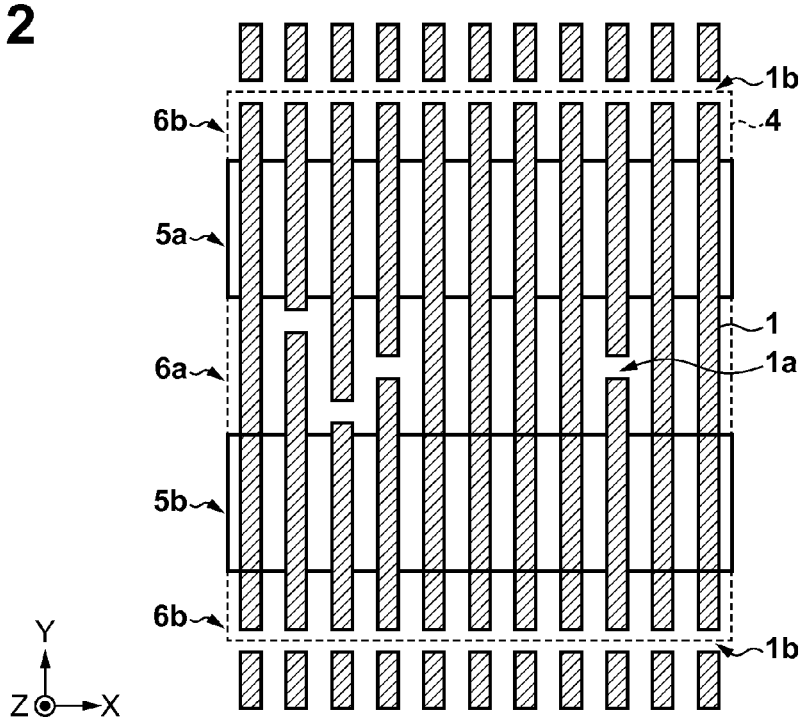
FIG. 2 is a view showing a configuration example of one standard cell.

A pattern formation method of an embodiment according to the present invention will be explained below. This embodiment can be used in the formation of, for example, a logic circuit 2. As shown in FIG. 1, the logic circuit 2 is formed by arranging a plurality of standard cells 4. The standard cell 4 is formed by a CMOS or the like. As shown in FIG. 2, therefore, a p-type active region 5a (a first active region), an n-type active region 5b (a second active region), and isolation regions 6 are formed on a substrate. FIG. 2 is a view showing a configuration example of one standard cell 4. The isolation regions 6 can include not only an isolation region 6a for electrically isolating the p-type active region 5a and n-type active region 5b, but also an isolation region 6b for electrically isolating the active regions 5 between two adjacent standard cells 4.

Figure 3:
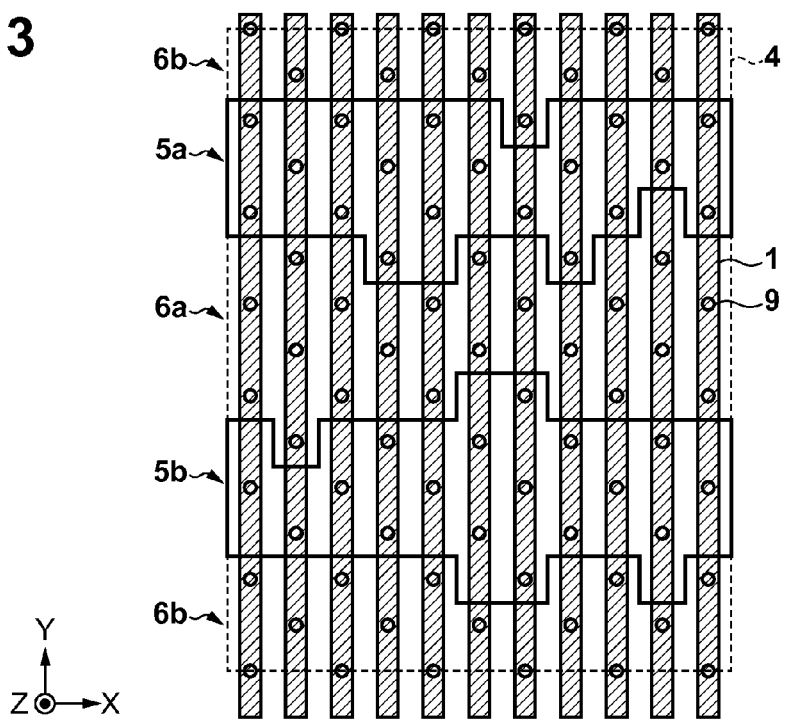
FIG. 3 is a view showing a configuration example of one standard cell.

Also, a line and space pattern (to be referred to as an L & S pattern hereinafter) is formed on the substrate. This L & S pattern includes a plurality of lines 1 (pattern elements), and each line 1 is formed on the substrate over the p-type active region 5a, n-type active region 5b, and isolation region 6a so as to extend along a direction (Y direction) in which these regions are arranged. Each line 1 formed as described above is used as the gate electrode of a FET in the p-type active region 5a and the gate electrode of a FET in the n-type active region 5b, and the same gate potential can be given to these FETs in the p-type active region 5a and n-type active region 5b. On the other hand, in order to give different gate potentials to the FETs in the p-type active region 5a and n-type active region 5b, it is necessary to partially remove (cut) the line 1 on the isolation region 6a. A portion 1a shown in FIG. 2 is a portion where the line 1 on the isolation region 6a is partially removed. Furthermore, to separately control the gate potentials in two adjacent standard cells, it is also necessary to partially remove (cut) the line 1 on the isolation region 6b between the two standard cells. A portion 1b shown in FIG. 2 is a portion where the line 1 on the isolation region 6b is removed. The plurality of lines 1 on the p-type active region 5a may have different lengths (in the Y direction), or the plurality of lines 1 on the n-type active region 5b may have different lengths (in the Y direction). If this is the case, as shown in FIG. 3, the plurality of lines 1 on the isolation region 6a may also have different lengths (in the Y direction).

A technique which forms an L & S pattern including a plurality of one-dimensional lines 1 on a substrate beforehand and forms a desired circuit pattern by processing the L & S pattern as described above is generally called a one-dimension layout technique. "Processing the L & S pattern" can include not only partially removing the L & S pattern but also connecting the lines 1 of the L & S pattern. As described above, the one-dimension layout technique is used in, for example, a step of forming the gate electrode of a FET, and one line 1 of the L & S pattern forms one gate electrode. The step of forming the L & S pattern on the substrate can be performed by using, for example, an exposure apparatus including a projection optical system. Within a range in which this exposure apparatus can resolve patterns, an L & S pattern can be formed on the substrate by transferring an L & S pattern formed on a mask onto the substrate by using the exposure apparatus. On the other hand, together with recent increasing of degrees of micropatterning and integration of circuit patterns, it has become necessary to form an L & S pattern including lines 1 having a line width smaller than the resolution limit of an exposure apparatus (a minimum line width which can be resolved by an exposure apparatus). However, an L & S pattern including lines having a line width smaller than the resolution limit of an exposure apparatus cannot be formed by simply performing an exposure step of exposing a mask pattern onto a substrate by using the exposure apparatus, a development step, and an etching step once each.

For example, a maximum NA (Numerical Aperture) of a projection optical system of an exposure apparatus using an ArF laser (wavelength=193 nm) is 1.35, so the resolution limit is 36 nm (=0.25×(193 nm/1.35)) for a half pitch. Therefore, an L & S pattern including lines 1 having a line width of 30 nm or less which is smaller than the resolution limit cannot be formed on a substrate by simply performing an exposure step, development step, and etching step once each. That is, an L & S pattern having a pitch of 60 nm or less which is smaller than the double of the resolution limit cannot be formed on a substrate by simply performing these steps once each. A method of forming an L & S pattern including lines 1 having a line width smaller than the resolution limit of an exposure apparatus will be explained below with reference to FIG. 4. For example, a method of forming an L & S pattern in which both the line width of lines 1 and space width between lines 1 are 20 nm will be explained. In the following explanation, L/S=20/20 nm represents a case in which both the line width of lines 1 and space width between lines 1 are 20 nm.

[L & S Pattern Formation Method]

Figure 4:
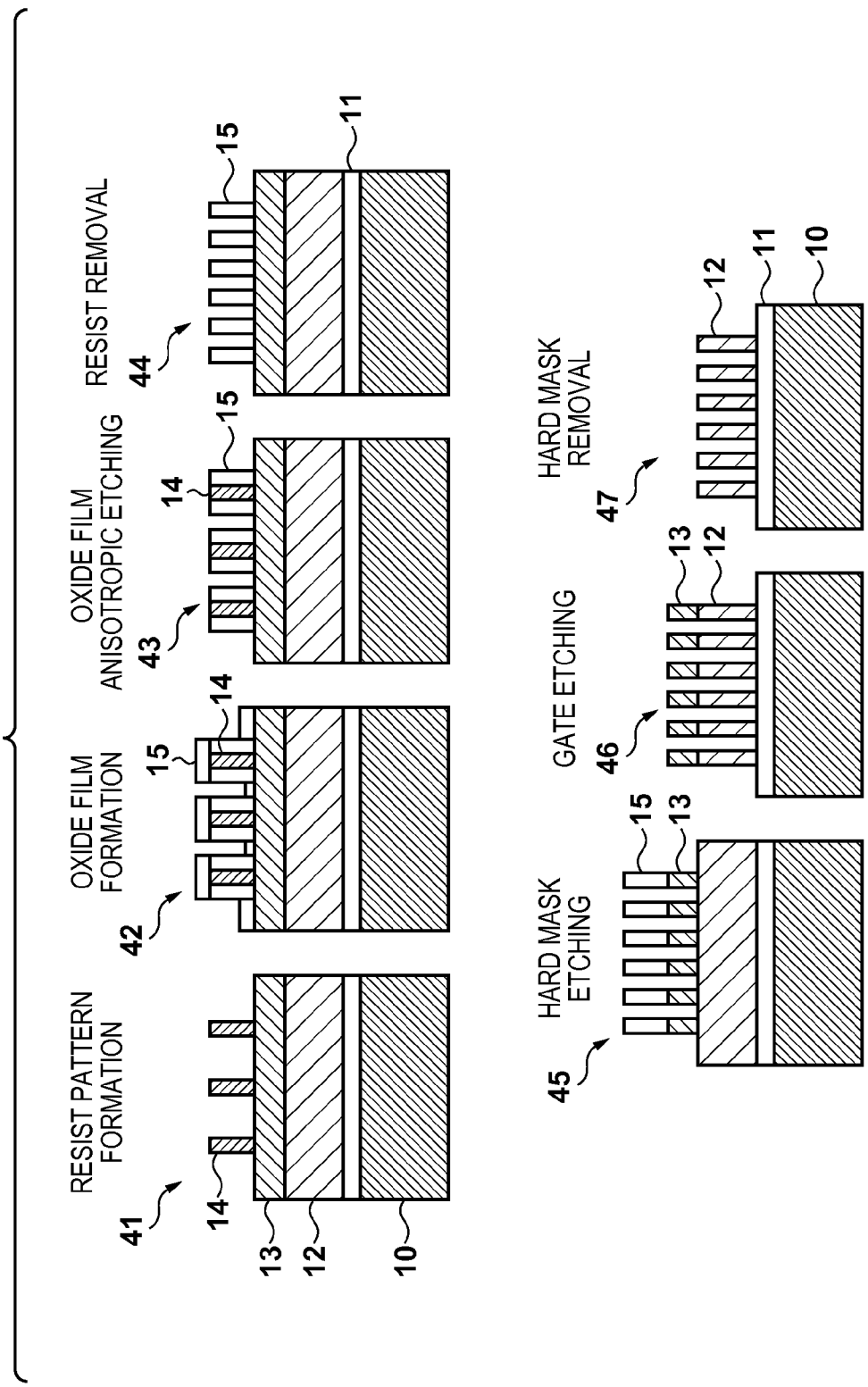
FIG. 4 is a view for explaining an L & S pattern formation method.

First, as indicated by 41 in FIG. 4, a gate oxide film 11, gate material 12, and hard mask 13 are formed on a silicon substrate 10, and a resist pattern of L/S=20/60 nm is formed on the hard mask 13. This resist pattern of L/S=20/60 nm can be formed by, for example, exposing a mask pattern of L/S=40/40 nm to a resist by using an exposure apparatus, and isotropically etching the resist by using oxygen plasma or the like.

After the resist pattern of L/S=20/60 nm is formed on the hard mask 13, an oxide film 15 is deposited by using CVD or sputtering as indicated by 42 in FIG. 4. The oxide film 15 is deposited so that the film thickness is the same as the line width of lines 1 of an L & S pattern, that is, the film thickness is 20 nm. Since the oxide film 15 is isotropically deposited, the film thickness of the oxide film 15 (called a sidewall) formed on the side surfaces of the resist on the hard mask 13 is also 20 nm, which is the same as the line width of the lines 1 of the L & S pattern. Although the oxide film 15 is deposited in this example, the oxide film 15 is used to etch the underlying hard mask 13, so the film is not limited to the oxide film 15 and may also be a carbon film or the like.

Then, as indicated by 43 in FIG. 4, the oxide film 15 is anisotropically etched until the upper surface of the resist formed on the hard mask 13 appears. Subsequently, as indicated by 44 in FIG. 4, the resist on the hard mask 13 is removed by using oxygen plasma or the like. Consequently, only the sidewalls remain on the hard mask 13, so a pattern of L/S=20/20 nm made of the oxide film 15 can be formed. This pattern of the oxide film 15 formed as described above is used as a mask to anisotropically etch the hard mask 13 as indicated by 45 in FIG. 4, and the oxide film 15 is removed. After that, the gate material 12 is anisotropically etched by using the hard mask 13 as a mask as indicated by 46 in FIG. 4. Consequently, as indicated by 47 in FIG. 4, an L & S pattern of L/S=20/20 nm made of the gate material 12 can be formed on the silicon substrate 10 (the gate oxide film 11).

[Partial Removal of L & S Pattern]

Figure 5:
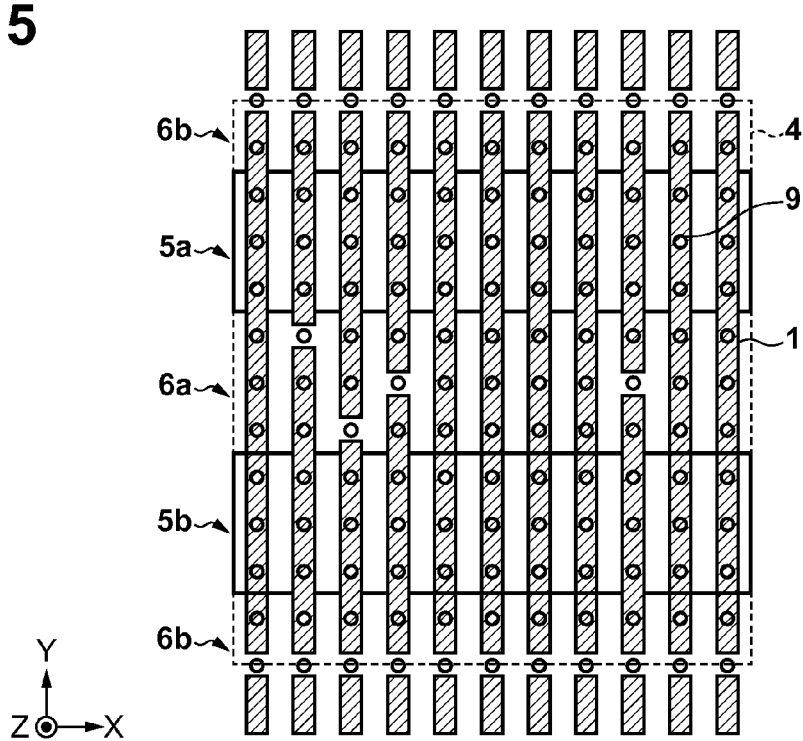
FIG. 5 is a view showing an example in which a plurality of cut elements of a cut pattern are located in accordance with an even grid.
Figure 6:
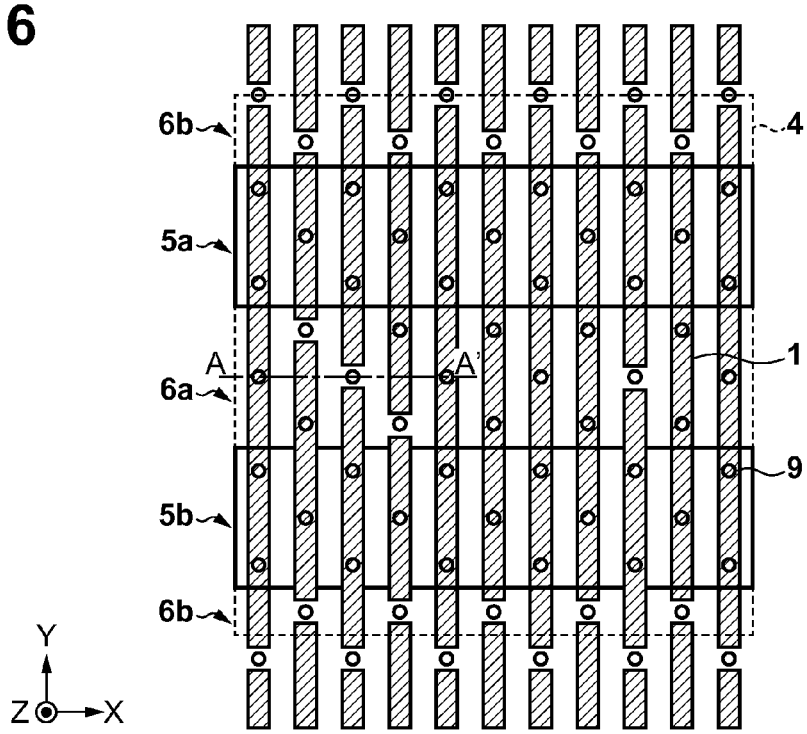
FIG. 6 is a view showing an example in which a plurality of cut elements of a cut pattern are located in accordance with a staggered grid.

A pattern to be used to partially remove the L & S pattern is called a cut pattern. A plurality of elements (cut elements 9) of this cut pattern can be located at the intersections of a matrix grid (even grid) having the same pitch as that of the L & S pattern. That is, the pitches of the L & S pattern and even grid are equal. FIG. 5 is a view showing an example in which the plurality of cut elements 9 of the cut pattern are located in accordance with the even grid. However, together with the recent further increase of the degrees of micropatterning and integration of circuit patterns, it has become necessary to partially remove an L & S pattern including lines 1 having a line width smaller than the resolution limit of an exposure apparatus. In this case, if the cut pattern is designed so that the plurality of cut elements 9 are located in accordance with the even grid, the line width and pitch of the plurality of cut elements become smaller than the resolution limit of an exposure apparatus. This may make it difficult to form an L & S pattern on the plurality of cut elements 9 by using the exposure apparatus. In this embodiment, therefore, the plurality of cut elements 9 of the cut pattern are located in accordance with a staggered grid as shown in FIG. 6. FIG. 6 is a view showing an example in which the plurality of cut elements 9 of the cut pattern are located in accordance with a staggered grid. For example, the cut pattern is so formed that the plurality of cut elements 9 are located on a plurality of lines of an L & S pattern. A plurality of cut elements 9 on one line are arranged, at an interval twice the pitch of the L & S pattern, along a direction (the Y direction) in which the line 1 extends. Also, the arrangement of the cut elements 9 on one of two adjacent lines and that of the cut elements 9 on the other line are shifted with each other by the pitch of the L & S pattern in the Y direction. By thus forming the cut pattern, the interval between the plurality of cut elements 9 of the cut pattern can be widened. This facilitates forming the plurality of cut elements 9 on the plurality of lines 1 of the L & S pattern formed on the substrate as described previously.

[Pattern Formation Method]

The pattern formation method according to this embodiment will be explained below. FIG. 7 is a flowchart showing the pattern formation method according to this embodiment. FIGS. 8A to 8D are views showing the standard cell 4 in each step of the pattern formation method. FIGS. 9A to 9D are views showing a section (XZ section) of the substrate in each step of the pattern formation method. FIGS. 9A to 9D each show a section taken along a broken line A-A' shown in FIG. 6. In the following explanation, the gate oxide film 11 shown in FIG. 4 will be omitted, and the silicon substrate 10 will simply be called "a substrate 3".

Figure 8A:
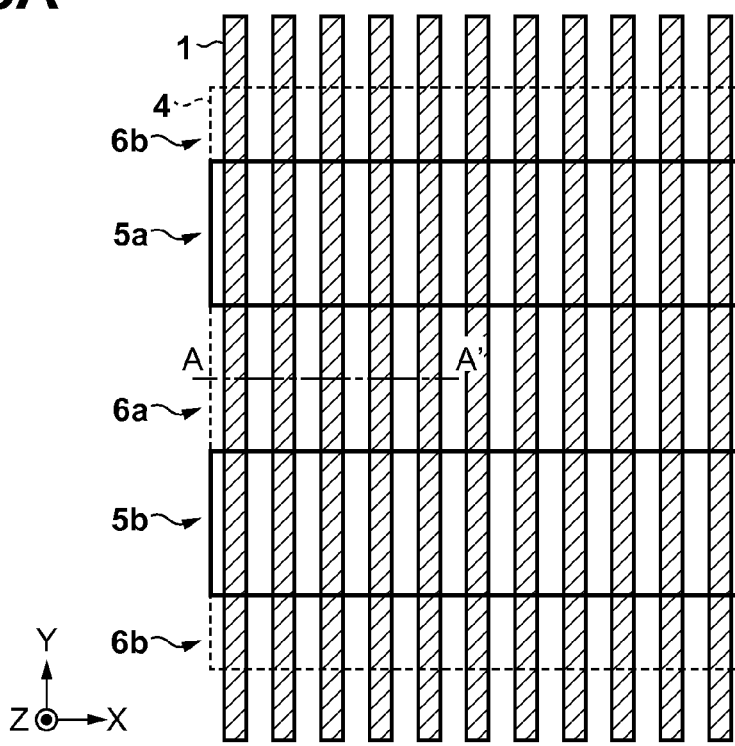
FIG. 8A is a view showing a standard cell in step S101 of the pattern formation method.
Figure 8B:
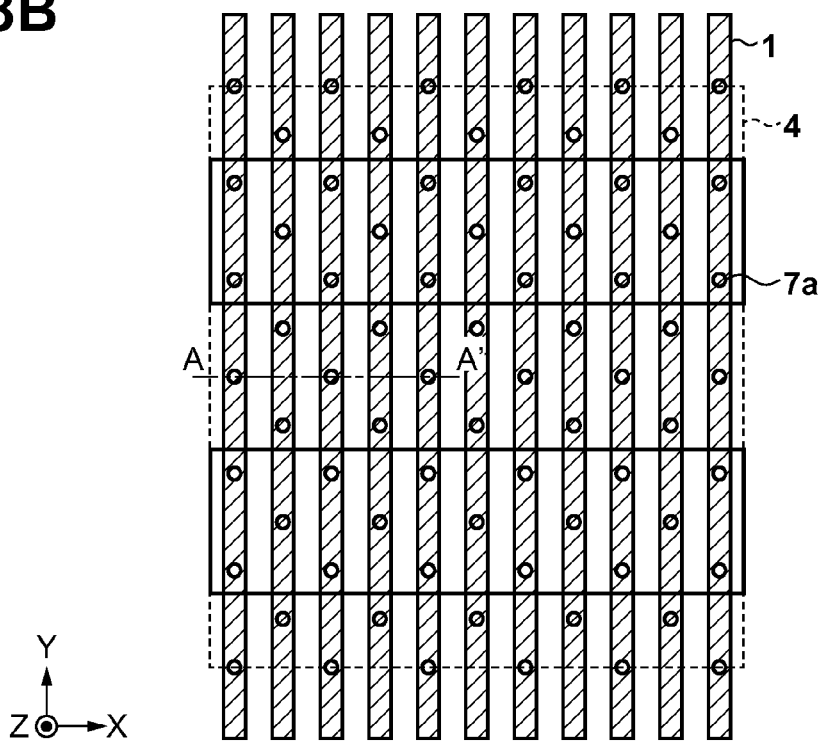
FIG. 8B is a view showing the standard cell in step S102 of the pattern formation method.
Figure 9A:
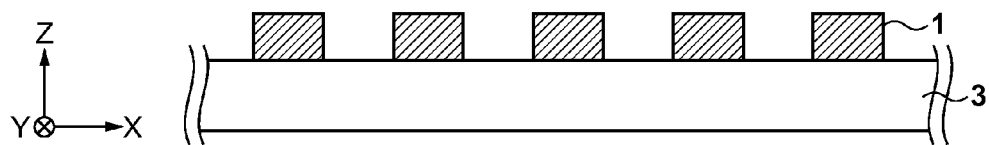
FIG. 9A is a view showing a section of a substrate in step S101 of the pattern formation method.
Figure 9B:
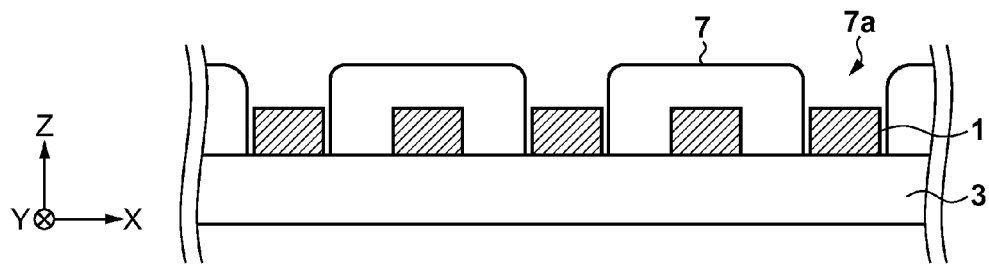
FIG. 9B is a view showing the section of the substrate in step S102 of the pattern formation method.

In step S101, an L & S pattern is formed on the substrate 3 as shown in FIG. 8A. This formation of the L & S pattern on the substrate 3 can be performed by, for example, the above-described method. In this step, a sectional view taken along the line segment A-A' is as shown in FIG. 9A. In step S102, as shown in FIG. 8B, a first layer 7 including a plurality of first openings 7a as the plurality of cut elements 9 of the cut pattern is formed on the L & S pattern. The first layer 7 can be formed by, for example, a resist or oxide film. A sectional view in this step is as shown in FIG. 9B. The plurality of first openings 7a are so located as to be staggered in accordance with the cut pattern, such that each first opening 7a corresponds to each cut element of the cut pattern. That is, the first layer 7 can be so formed that a plurality of first openings 7a on one line 1 are arranged at an interval twice the pitch of the L & S pattern along the direction (Y direction) in which the line 1 extends. Also, the first layer 7 can be formed such that the arrangement of the first openings 7a on one of two adjacent lines 1 and that of the first openings 7a on the other line are shifted with each other by the pitch of the L & S pattern in the Y direction. Referring to FIG. 8B, the size of each first opening 7a is smaller than the width of the line 1 of the L & S pattern. In practice, however, the size of each first opening 7a may be larger than the width of the line 1 in order to facilitate partially removing the line 1.

Two methods described in non-patent literature 2 are examples of the method of forming the first layer including the plurality of first openings 7a located to be staggered as described above. Non-patent literature 2 describes the two methods, that is, an EKB process and DTD (Dual Tone Development) process. These methods are not developed to partially remove the L & S pattern, but they are applicable to the one-dimension layout technique. In the EKB process, a plurality of resist patterns each formed into a columnar shape are located in the form of an even grid, and an oxide film is deposited and etched back based on the resist patterns. After that, a layer of the oxide film in which a plurality of openings are located to be staggered can be formed by removing the resist patterns. In the DTD process, the substrate 3 on which the L & S pattern is formed is coated with a resist, and positive development and negative development are successively performed on the resist, thereby forming a layer of the resist in which a plurality of openings are located to be staggered.

Figure 8C:
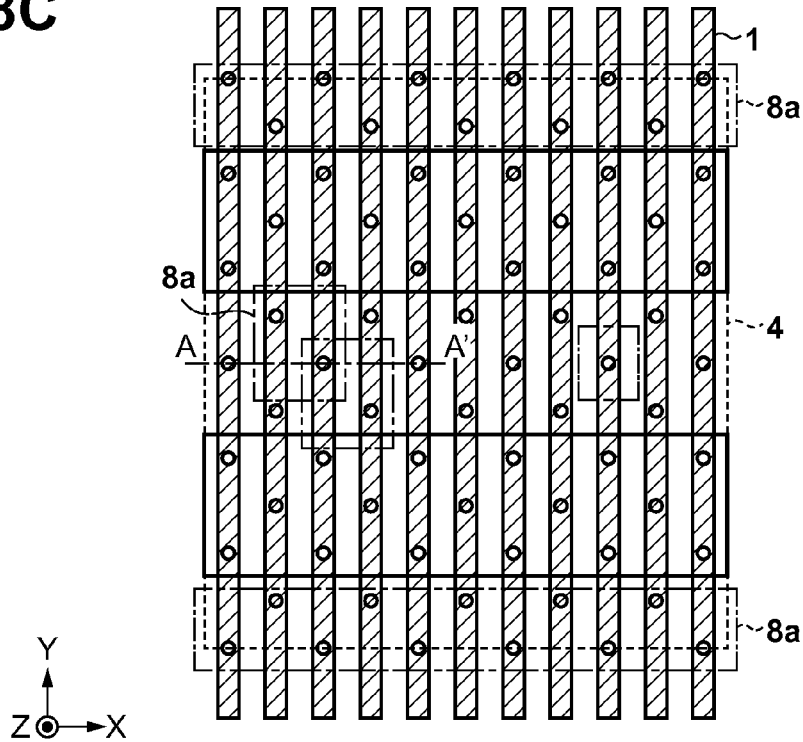
FIG. 8C is a view showing the standard cell in step S104 of the pattern formation method.
Figure 9C:
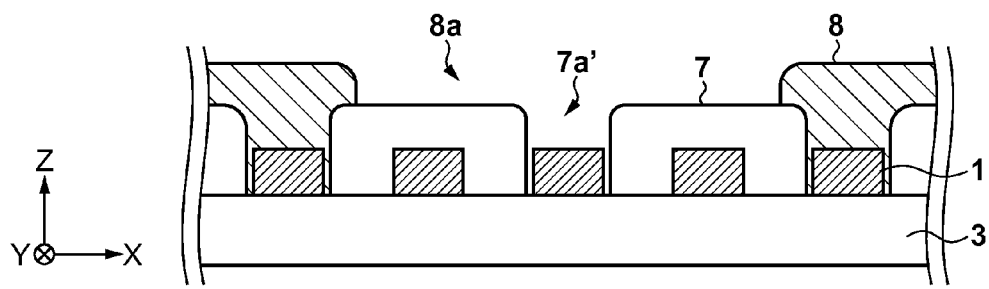
FIG. 9C is a view showing the section of the substrate in step S104 of the pattern formation method.

In step S103, first openings 7a' to be used to partially remove the L & S pattern is selected from the plurality of first openings 7a formed in the first layer 7. In step S104, as shown in FIG. 8C, a second layer 8 including one or more second openings 8a each of which exposes the one or more first openings 7a' selected in step S103 is formed on the first layer 7 formed in step S102. The second layer 8 can be formed by, for example, a resist or oxide film. A sectional view in this step is as shown in FIG. 9C. The second opening 8a formed as described above can be formed to have a size larger than the resolution limit of an exposure apparatus. The second layer 8 may also be formed to expose two or more first openings 7a' selected in step S103 to one second opening 8a.

Figure 8D:
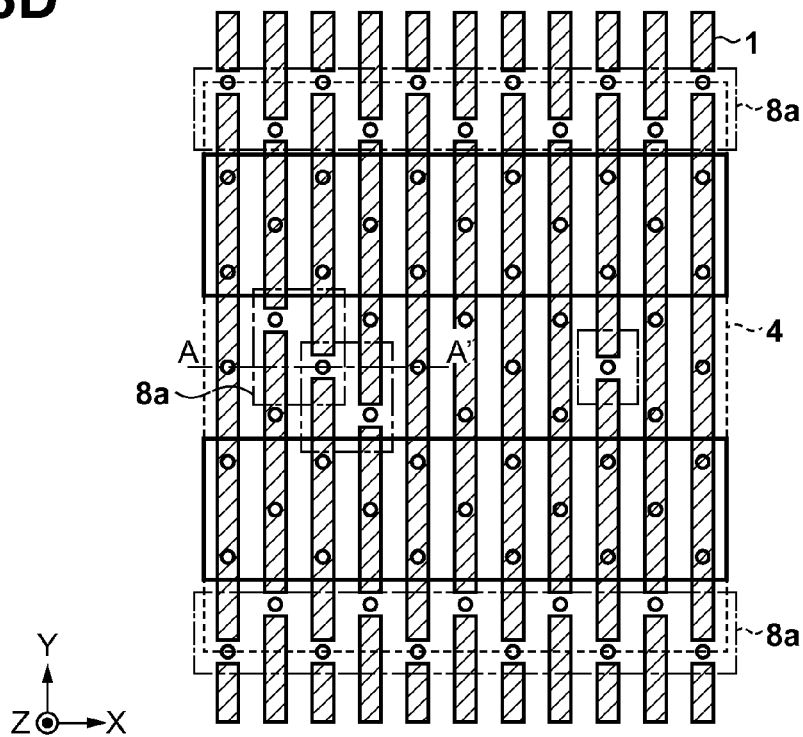
FIG. 8D is a view showing the standard cell in step S105 of the pattern formation method.
Figure 9D:
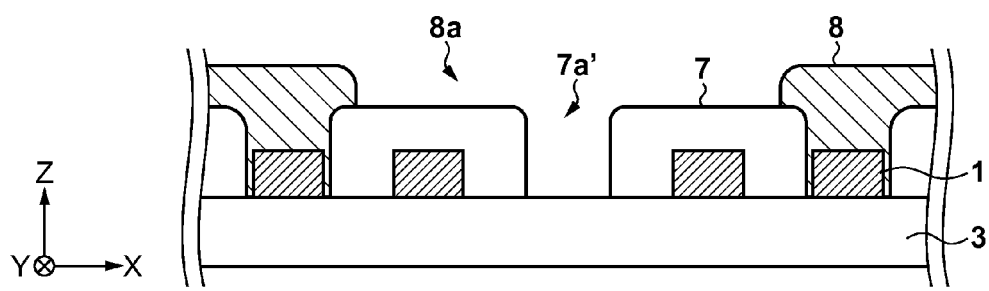
FIG. 9D is a view showing the section of the substrate in step S105 of the pattern formation method.
Figure 10:
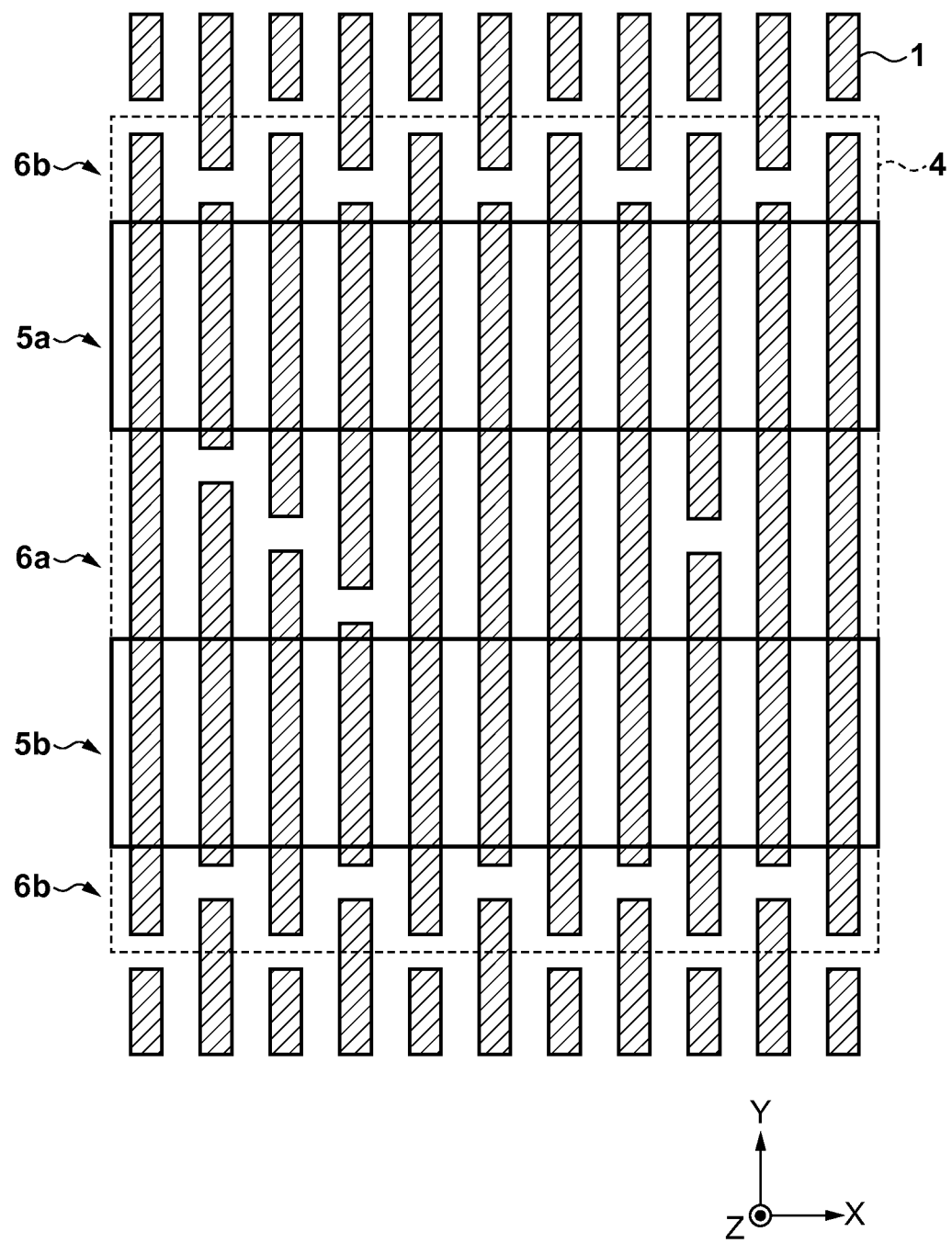
FIG. 10 is a view showing a circuit pattern formed on the substrate by using the pattern formation method of the embodiment.

In step S105, as shown in FIG. 8D, the L & S pattern is partially removed through the first opening 7a' of the first layer 7 and the second opening 8a of the second layer 8 by a process such as sputtering or etching. A sectional view in this step is as shown in FIG. 9D. In step S106, the first layer 7 and second layer 8 are removed. Consequently, as shown in FIG. 10, a desired circuit pattern can be formed on the substrate 3 by partially removing the L & S pattern formed on the substrate 3. FIG. 10 is a view showing the circuit pattern formed on the substrate 3 by using the pattern formation method of this embodiment.

As described above, the pattern formation method according to this embodiment forms the first layer 7 including the plurality of first openings 7a located to be staggered on the L & S pattern including the lines 1 having a line width smaller than the resolution limit of an exposure apparatus. In addition, the second layer 8 including the second opening 8a which exposes the one or more first openings 7a to be used to partially remove the L & S pattern is formed on the first layer 7. Then, the L & S pattern is partially removed through the first opening 7a and second opening 8a. As a consequence, a desired circuit pattern can be formed on the substrate by partially removing the L & S pattern including the lines 1 having a line width smaller than the resolution limit of an exposure apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-158123 filed Aug. 1, 2014, which is hereby incorporated by reference herein in its entirety.

What is claimed is:

1. A pattern formation method of forming a pattern on a substrate by partially removing a line and space pattern formed on the substrate, comprising:

a first formation step of forming a first layer including a plurality of first openings on the line and space pattern;

a second step of forming, on the first layer, a second layer including a second opening for exposing one or more first openings, which are used to partially remove the line and space pattern, among the plurality of first openings; and a removing step of partially removing the line and space pattern through the second opening and the one or more first openings, wherein the plurality of first openings are located on a plurality of lines of the line and space pattern, wherein a plurality of first openings on one line are arranged at an interval twice that of a pitch of the line and space pattern along a direction in which the one line extends, and wherein an arrangement of a plurality of first openings on one of two adjacent lines and an arrangement of a plurality of first openings on the other of the two adjacent lines are shifted with each other by the pitch in the direction.

2. The method according to claim 1, wherein the substrate includes an isolation region for electrically isolating a plurality of active regions, at least a portion of the line and space pattern is formed on the isolation region, in the first formation step, at least one first opening is located on the line of the portion of the line and space pattern on the isolation region, and the one or more first openings to be exposed by the second opening are formed on the isolation region.

3. The method according to claim 2, wherein the substrate further includes a first active region and a second active region, the isolation region is located between the first active region and the second active region, and at least one line of the line and space pattern is formed on and over the first active region, the second active region, and the isolation region.

4. The method according to claim 2, wherein the plurality of lines are formed on the substrate such that lengths on the isolation region in the direction are different from each other.

5. The method according to claim 1, wherein in the second formation step, the second layer is formed such that one second opening exposes at least two first openings to be used to partially remove the line and space pattern.

6. The method according to claim 1, wherein a size of the one or more first openings is larger than a width of one line of the line and space pattern.

7. The method according to claim 1, wherein in the first formation step, the plurality of first openings are formed by using one of an EKB process and a DTD process.

* * * * *